US009858879B2

(12) United States Patent
Cao

(10) Patent No.: US 9,858,879 B2
(45) Date of Patent: Jan. 2, 2018

(54) DRIVING CIRCUIT WITH A FEED THROUGH VOLTAGE COMPENSATION AND ARRAY SUBSTRATE

(71) Applicants: Shanghai AVIC Optoelectronics Co., Ltd., Shanghai (CN); Tianma Micro-Electronics Co., Ltd., Shenzhen (CN)

(72) Inventor: Zhaokeng Cao, Shanghai (CN)

(73) Assignees: SHANGHAI AVIC OPTOELECTRONICS CO., LTD., Shanghai (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 153 days.

(21) Appl. No.: 14/243,709

(22) Filed: Apr. 2, 2014

(65) Prior Publication Data

US 2015/0002382 A1 Jan. 1, 2015

(30) Foreign Application Priority Data

Jun. 28, 2013 (CN) .......................... 2013 1 0271046

(51) Int. Cl.
*G09G 3/36* (2006.01)
*G11C 19/18* (2006.01)
*G11C 19/28* (2006.01)

(52) U.S. Cl.
CPC ......... *G09G 3/3677* (2013.01); *G11C 19/184* (2013.01); *G11C 19/28* (2013.01);
(Continued)

(58) Field of Classification Search
CPC .. G09G 3/3677; G09G 3/3674; G09G 3/3655; G09G 2310/0286
USPC ........................................................ 345/92
See application file for complete search history.

(56) References Cited

U.S. PATENT DOCUMENTS

2008/0217687 A1* 9/2008 Tsou ................. G02F 1/136259
257/347
2009/0086116 A1* 4/2009 Pak ...................... G09G 3/3655
349/38
(Continued)

FOREIGN PATENT DOCUMENTS

CN 101256327 A 9/2008
CN 101533171 A 9/2009
(Continued)

OTHER PUBLICATIONS

1st Office Action as received in corresponding Chinese Application No. 201310271046.2, dated Feb. 22, 2016 and English summary thereof.

*Primary Examiner* — Yuzhen Shen
(74) *Attorney, Agent, or Firm* — Alston & Bird LLP

(57) ABSTRACT

A driving circuit with a feed through voltage compensation includes multiple gate scanning lines, multiple storage capacitance lines and multiple stages of common driving units. The common driving unit includes a gate driver and a storage capacitance driver, where the gate driver is connected to a gate scanning line to output a gate scanning signal, and the storage capacitance driver is connected to a storage capacitance line to output a storage capacitance signal. The storage capacitance signal outputted from the storage capacitance driver is adapted to compensate the gate scanning signal output from the gate driver. The driving circuit with the feed through voltage compensation allows a large gate-to-drain parasitic capacitance of the pixel, and the width of the black matrix may become smaller; therefore the pixel aperture ratio may be increased, the cost may be reduced, or the power consumption may be reduced.

20 Claims, 10 Drawing Sheets

(52) U.S. Cl.
 CPC ......... *G09G 3/3655* (2013.01); *G09G 3/3674* (2013.01); *G09G 2310/0286* (2013.01)

(56) References Cited

U.S. PATENT DOCUMENTS

| | | |
|---|---|---|
| 2009/0231504 A1 | 9/2009 | Toya et al. |
| 2009/0322975 A1* | 12/2009 | Song ................. G02F 1/133707 349/46 |
| 2010/0245305 A1* | 9/2010 | Yokoyama ........... G09G 3/3655 345/205 |
| 2010/0245328 A1* | 9/2010 | Sasaki .................. G09G 3/3655 345/211 |
| 2012/0300133 A1* | 11/2012 | Saitoh .................. G09G 3/3607 348/731 |
| 2013/0314392 A1* | 11/2013 | Kim ......................... G09G 3/20 345/212 |
| 2014/0168181 A1* | 6/2014 | Furuta ..................... G11C 19/28 345/205 |
| 2014/0168182 A1* | 6/2014 | Yamamoto ........... G09G 3/3655 345/205 |
| 2014/0191935 A1* | 7/2014 | Morii .................. G09G 3/3677 345/92 |

FOREIGN PATENT DOCUMENTS

| | | |
|---|---|---|
| CN | 101614915 A | 12/2009 |
| CN | 101965607 A | 2/2011 |
| EP | 2224423 A1 | 1/2010 |
| WO | 2013002228 A1 | 1/2013 |
| WO | 2013021930 A1 | 2/2013 |

\* cited by examiner

DRIVING CIRCUIT WITH A FEED THROUGH VOLTAGE COMPENSATION AND ARRAY SUBSTRATE

CROSS-REFERENCES TO RELATED APPLICATIONS

This application claims the benefit of priority to Chinese Patent Application No. 201310271046.2, filed with the Chinese Patent Office on Jun. 28, 2013 and entitled "DRIVING CIRCUIT WITH A FEED THROUGH VOLTAGE COMPENSATION AND ARRAY SUBSTRATE", the content of which is incorporated herein by reference in its entirety.

FIELD OF THE INVENTION

The present disclosure relates to the field of liquid crystal displays, and in particular to a driving circuit with a feed through voltage compensation and an array substrate.

BACKGROUND OF THE INVENTION

Generally, a liquid crystal display includes an upper substrate, a lower substrate and a liquid crystal layer disposed between the upper substrate and the lower substrate. The liquid crystal display includes multiple pixel units. Each pixel unit includes a pixel electrode and a common electrode, and a liquid crystal capacitance may be formed between the pixel electrode and the common electrode. The orientations of liquid crystal molecules rotated or twisted may vary (be controlled) by the pixel voltage applied between the pixel electrode and the common electrode. Therefore, the transmittance of light passing through the liquid crystal layer may be controlled, and the brightness of each pixel unit of the liquid crystal display may be controlled.

FIG. 1 is an equivalent circuit diagram illustrating a pixel unit of a conventional liquid crystal display 100. The liquid crystal display 100 includes a gate driver 111, a source driver 112, multiple gate lines 121 and multiple data lines 122. The gate lines 121 are separated from the data lines 122. The intersection of the gate lines 121 and data lines 122 defines multiple pixel units 130. Each pixel unit 130 includes a liquid crystal capacitor 127 formed by a pixel electrode 124 and a common electrode 125, and a storage capacitor 128 formed by the pixel electrode 124 and a storage capacitance line. A thin-film transistor 123 includes a gate 1231 connected to the gate driver 111 via the gate line 121, a source 1232 connected to the source driver 112 via the data line 122, and a drain 1233 connected to the pixel electrode 124.

When the liquid crystal display 100 is in an operation state, two different voltages are applied to the pixel electrode 124 and the common electrode 125 respectively to form an electric field for controlling the liquid crystal layer, and the orientation of liquid crystal molecules may vary by the applied pixel voltage. Therefore, the transmittance of light passing through the liquid crystal layer may be controlled, and the brightness of each pixel unit of the liquid crystal display may be controlled. In order to get a better transmittance and brightness of light, a certain pixel voltage needs to be maintained, i.e., a certain potential difference needs to be maintained between the pixel electrode 124 and the common electrode 125.

FIG. 2 is a schematic diagram of an operation waveform of a pixel unit in the prior art. As shown in FIG. 1 and FIG. 2, in a driving process, the gate driver 111 may output a gate scanning signal $V1_g$ to the gate 1231 of the thin-film transistor 123 via the gate line 121, and output a common voltage signal $V1_{com}$ to the common electrode 125; the source driver 112 may output a source signal $V1s$ to the source 1232 of the thin-film transistor 123 via the data line 122. As shown in FIG. 2, within each frame cycle, the common electrode 125 may maintain a constant potential $V1_{com}$. When the gate scanning signal $V1_g$ is at a rising edge, the thin-film transistor 123 may be switched on; when the gate scanning signal $V1_g$ is at a falling edge, the thin-film transistor 123 may be switched off. The source 1232 may maintain a constant potential higher than the potential of the common electrode 125 in a period which is from a time before the thin-film transistor 123 is switched on to a time after the thin-film transistor 123 is switched off. When the thin-film transistor 123 is switched on, the potential of the drain 1233 may begin to increase until it reaches the same potential as the source 1232. Thus, a voltage may be maintained between the common electrode 125 and the pixel electrode 124 connected to the thin-film transistor 123.

However, a parasitic capacitance exists between the gate and the drain of a thin-film transistor. Because of the coupling of the parasitic capacitance, a feed through effect exists in the thin-film transistor 123. That is, as soon as the gate 1231 is cut off, the potential of the drain 1233 may abruptly decrease comparing with the potential of the source 1232, where the decreased potential difference refers to as a feed through voltage. The potential change of the drain 1233 is shown in the waveform $V1_d$ in FIG. 2. Due to the feed through voltage generated from the feed through effect, the potential of the drain 1233 may decrease, i.e., the potential of the pixel electrode 124 may decrease, and therefore the voltage between the pixel electrode 124 and the common electrode 125 may become lower than a predetermined pixel voltage, which may affect the orientations of liquid crystal molecules and the transmittance and brightness of light of the liquid crystal display 100. Therefore, due to the feed through effect, after the thin-film transistor 123 is switched off, the liquid crystal display 100 may be provided with different transmittances and brightness of light, i.e., a flicker may occur, and thereby the image quality of the liquid crystal display 100 may be affected.

Therefore, as shown in a top view of the pixel unit in the prior art shown in FIG. 3a, the horizontal gate scanning lines 121 intersects with the vertical data lines 122 to form pixel units. The gate scanning lines and the data lines are insulated from each other by an insulating layer. Each pixel unit includes a pixel electrode 124, a storage capacitance line 22 paralleling the gate scanning line 121, and a parasitic capacitance between the gate scanning line 121 and the drain 1233 (i.e., a gate drain parasitic capacitance $C_{gd}$), which have all been designed carefully. The parasitic capacitance may be designed as small as possible to obtain a small feed through voltage. That is, the overlapped area of the gate and the drain, excepting the area for driving the thin-film transistor where the gate and the drain are overlapped, is as small as possible, and therefore the liquid crystal display may have a good performance.

FIG. 3b is a sectional view taken along A-A' of FIG. 3a, showing the top view of the pixel unit in the prior art. As shown in FIG. 3b, the gate scanning line 121 is disposed on the substrate 28. A gate insulating layer 25 is disposed on the gate scanning line 121. The drain 1233 is disposed on the gate insulating layer 25. A passivation layer 26 is disposed on the gate insulating layer 25 and the drain 1233. The pixel electrode 124 is disposed on the passivation layer 26. A gap 23 exists between the drain 1233 and the gate scanning line 121 (i.e., the non-overlapped area of the gate and the drain). In order to avoid the possible light leak from the gap 23, a black matrix 29 of a color filter disposed above the gate line 121 may be adopted to shield the light leak. The width of the black matrix 29 may be greater due to the gap 23. Therefore, the aperture ratio of the entire pixel may be affected. In an energy-shortage era, the increasing of the aperture ratio of the pixel may lead to the reduction in cost and power consumption.

BRIEF SUMMARY OF THE INVENTION

One inventive aspect is a driving circuit with a feed through voltage compensation, the driving circuit comprises a plurality of gate scanning lines, a plurality of storage capacitance lines, and a plurality of stages of common driving units connected in series, each of the stages of the common driving units being associated with one of the gate scanning lines and one of the storage capacitance lines, each common driving unit comprising a gate driver and a storage capacitance driver, the gate driver having an input, an output, and a reset port, the storage capacitance driver having an input, an output, and a reset port, wherein: an output of an Nth stage gate driver is connected to an associated gate scanning line to provide a gate scanning signal, N being an integer greater than 1, the output of the Nth stage gate driver is further connected to an input of an N+1th stage gate driver and an input of the N+1th stage storage capacitance driver, an output of the Nth stage storage capacitance driver is connected to an associated storage capacitance line to provide a storage capacitance signal; a reset port of the Nth stage gate driver and a reset port of the Nth stage storage capacitance driver are connected to an output of the N+1th stage gate driver to receive a gate scanning signal of the N+1th stage gate driver, and the storage capacitance signal provided by the Nth stage storage capacitance driver is adapted to compensate the gate scanning signal provided by the Nth stage gate driver.

Another inventive aspect is an array substrate, comprising a display area and a non-display area, wherein the non-display area comprises a driving circuit having a feed through voltage compensation, the driving circuit comprises a plurality of gate scanning lines, a plurality of storage capacitance lines, and a plurality of stages of common driving units connected in series, each of the stages of the common driving units being associated with one of the gate scanning lines and one of the storage capacitance lines, each common driving unit comprising a gate driver and a storage capacitance driver, the gate driver having an input, an output, and a reset port, the storage capacitance driver having an input, an output, and a reset port, wherein: an output of an Nth stage gate driver is connected to an associated gate scanning line to provide a gate scanning signal, N being an integer greater than 1, the output of the Nth stage gate driver is further connected to an input of an N+1th stage gate driver and an input of the N+1th stage storage capacitance driver, an output of the Nth stage storage capacitance driver is connected to an associated storage capacitance line to provide a storage capacitance signal, an reset port of the Nth stage gate driver and a reset port of the Nth stage storage capacitance driver are connected to an output of the N+1th stage gate driver to receive a gate scanning signal of the N+1th stage gate driver; and the storage capacitance signal provided by the storage capacitance driver is adapted to compensate the gate scanning signal provided by the gate driver, wherein the display area comprises the plurality of the gate scanning lines, a plurality of data lines, a plurality of pixel units defined by intersections of the gate scanning lines and the data lines, each of the pixel units comprising a pixel electrode, a plurality of storage capacitance lines, a plurality of storage capacitances formed between the pixel electrodes and the storage capacitance lines, and a plurality of thin-film transistors disposed at the intersections of the gate scanning lines and the data lines, wherein a thin-film transistor comprises a source connected to a data line and a drain connected to a pixel electrode, and wherein the drain partially overlaps with a portion of a gate scanning line.

DETAILED DESCRIPTION OF THE INVENTION

A driving circuit with a feed through voltage compensation and an array substrate provided by the disclosure may be specified in conjunction with drawings and embodiments. The advantages and characteristics of the disclosure may be clarified by the following illustrations and claims. It should be noted that, the drawings may describe the disclosure clearly in a simplified way.

In these embodiments of the present invention, the term "cycle" is to be understood to include two phases, i.e., one phase is a half of the cycle.

Figure 1:
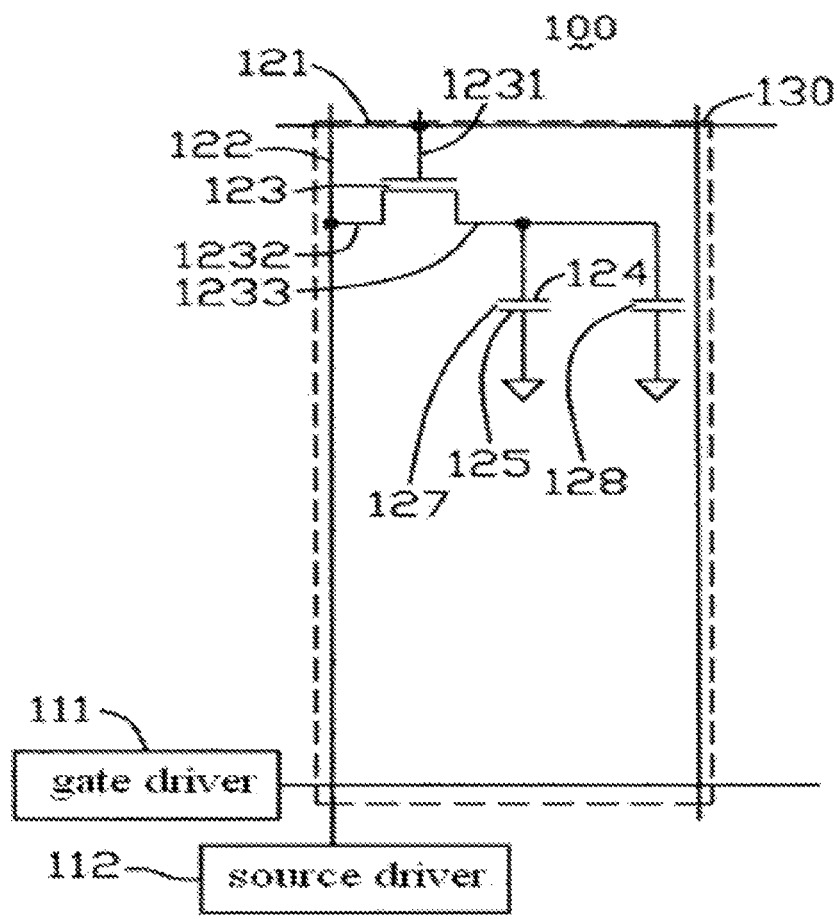
FIG. 1 is an equivalent circuit diagram of a pixel unit in the prior art.
Figure 2:
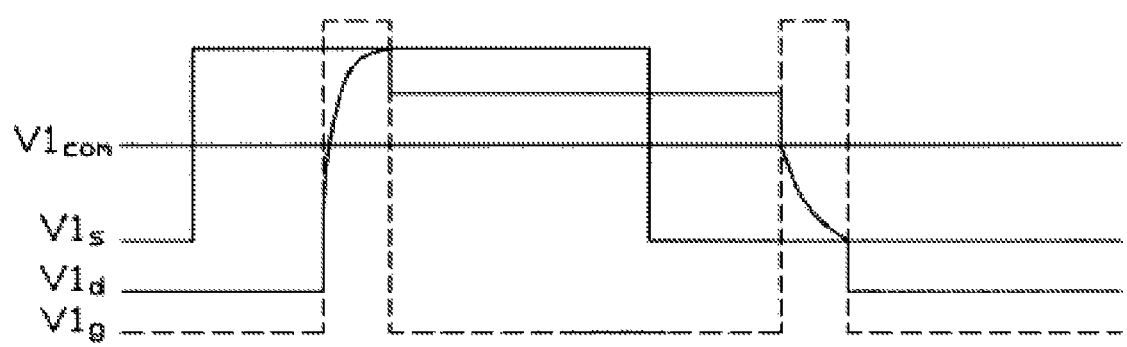
FIG. 2 is a schematic diagram of an operation waveform of a pixel unit in the prior art.
Figure 3A:
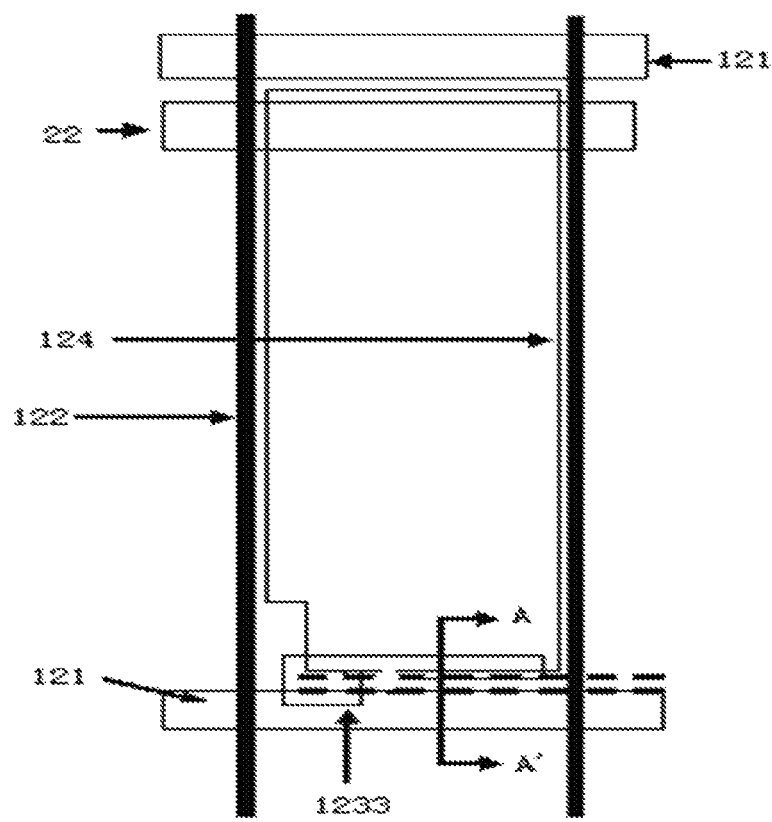
FIG. 3a is a top view of a pixel unit in the prior art.
Figure 3B:
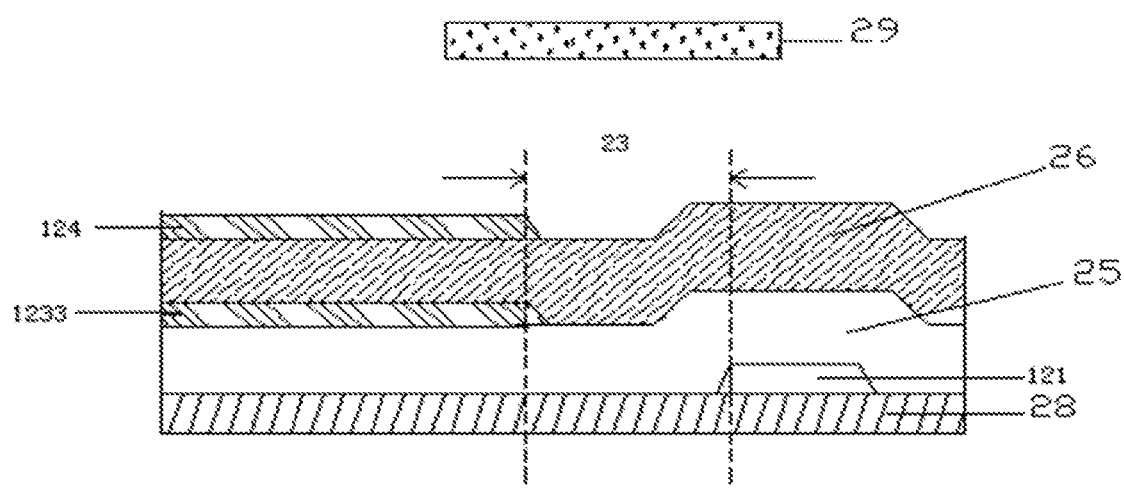
FIG. 3b is a sectional view taken along A-A' of FIG. 3a, showing the top view of the pixel unit in the prior art.
Figure 4:
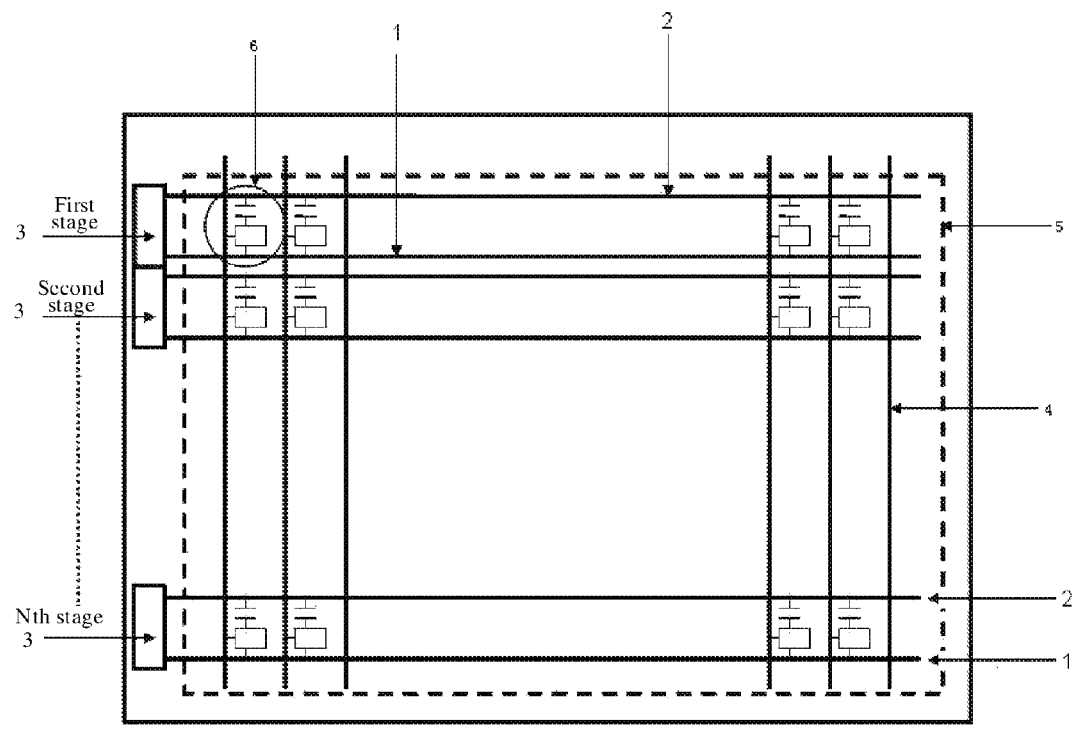
FIG. 4 is a schematic diagram of a driving circuit of a liquid crystal display panel according to an embodiment of the present invention.
Figure 5:
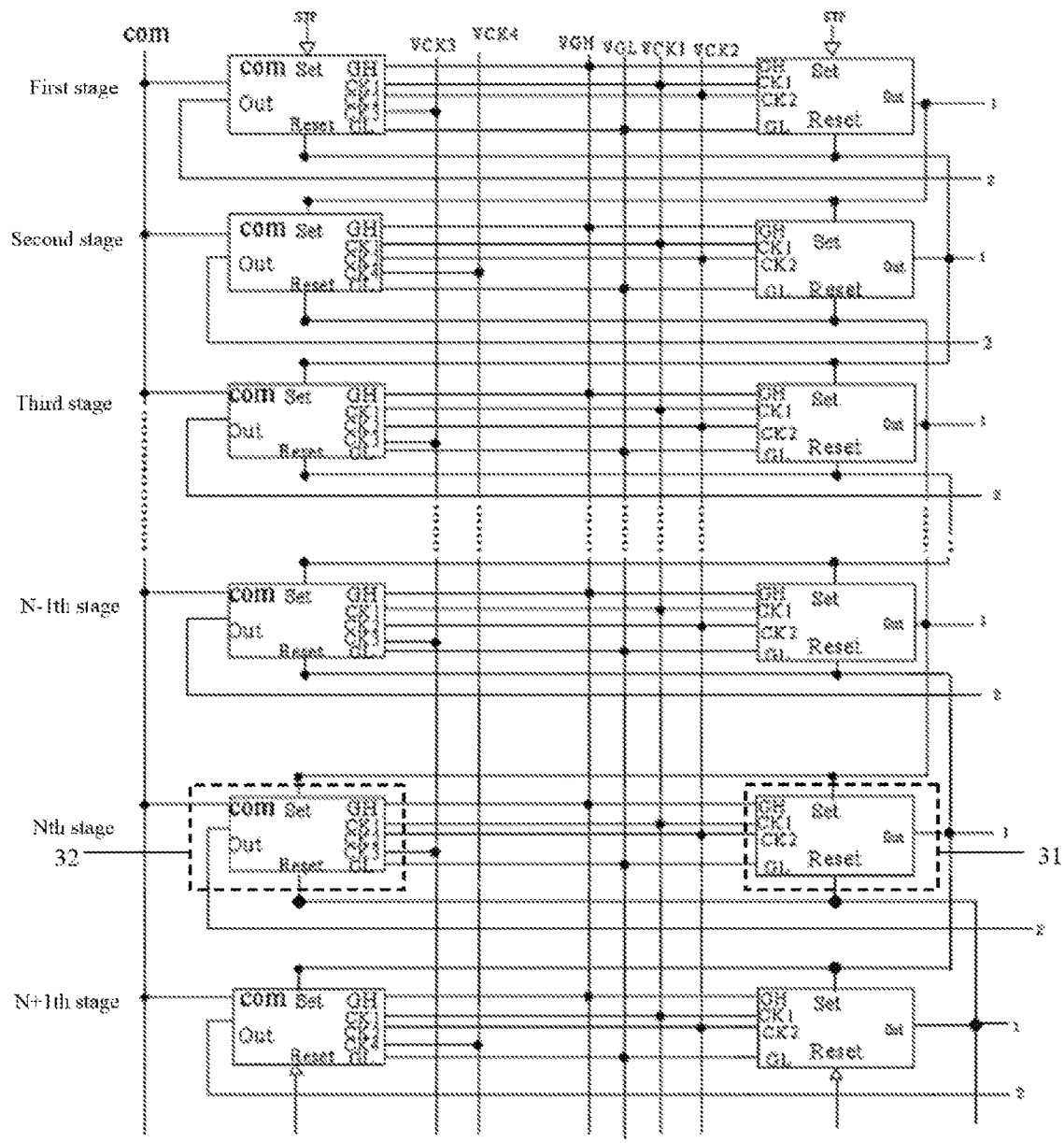
FIG. 5 is a schematic diagram of a connection of multi-stages of common driving units according to an embodiment of the present invention.

FIG. 4 is a schematic diagram of a driving circuit of a liquid crystal display panel according to an embodiment of the present invention. FIG. 5 is a schematic diagram of a connection of multi-stages of common driving units according to an embodiment of the present invention. Referring to FIG. 4, a driving circuit with a feed through voltage compensation includes: multiple gate scanning lines 1; multiple storage capacitance lines 2; multi-stages of common driving units 3 and multiple data lines 4.

The multiple gate scanning lines 1 are generally disposed in parallel to each other. The multiple storage capacitance lines 2 are generally disposed in parallel, and the storage capacitance lines 2 are parallel to the gate scanning lines 1. The Nth stage common driving unit 3 is connected to the Nth stage gate scanning line 1 and Nth stage storage capacitance line 2, and the respective common driving units 3 are connected in series. The multiple data lines 4 are intersected with multiple gate scanning lines 1. Generally, the multiple data lines 4 are disposed in parallel to each other. The data lines 4 intersect the gate scanning lines 1. The data lines and the gate scanning lines 1 are insulated from each other through an insulating layer.

As the schematic diagram of the circuit connection of multi-stages of common driving units 3 shown in FIG. 5, each common driving unit 3 includes a gate driver 31 and a storage capacitance driver 32. An output Out of the Nth stage gate driver 31 is connected to an end of the Nth stage gate scanning line 1 to provide a gate scanning signal. In addition, the output Out of the Nth stage gate driver 31 is connected to an input Set of the N+1th stage gate driver 31 and an input Set of the N+1th stage storage capacitance driver 32. An output Out of the Nth stage storage capacitance driver 32 is connected to an end of the Nth stage storage capacitance line 2 to provide a storage capacitance signal. A reset port Reset of the Nth stage gate driver 31 and a reset port Reset of the Nth stage storage capacitance driver 32 are connected to an output Out of the N+1th stage gate driver 31 to receive a gate scanning signal of the N+1th stage gate driver 31, where N is a positive integer greater than 1. In addition, the storage capacitance signal output from the storage capacitance driver 32 is adapted to compensate the gate scanning signal output from the gate driver 31.

The structure of the gate driver 31 and the driving process in time sequence thereof may be described below.

As shown in FIG. 5, the gate driver 31 in each stage includes an input Set, an output Out, a reset port Reset, a first level signal port GH, a second level signal port GL, a first clock signal port CK1 and a second clock signal port CK2. The first level signal port GH receives a first level signal VGH; and the second level signal port GL receives a second level signal VGL. The first clock signal port CK1 receives a first clock signal VCK1; and the second clock signal port CK2 receives a second clock signal VCK2.

The input Set of the first stage gate driver 31 receives an initial pulse signal STP. Generally, the initial pulse signal STP may transmit a high level signal at the beginning of an operation. The initial pulse signal has a high voltage level in a range between 10V and 25V, and a low voltage level in a range between −12 V and −8 V. The output Out of the first stage gate driver 31 outputs a gate scanning signal to the gate scanning line 1, and the output Out of the first stage gate driver 31 also outputs the gate scanning signal to the input Set of the second stage gate driver. The reset port Reset of the first stage gate driver 31 receives a gate scanning signal output from the output Out of the second stage gate driver 31 as a reset signal;

The input Set of the Nth stage gate driver 31 receives a gate scanning signal output from the output Out of the N−1th stage gate driver 31. The output Out of the Nth stage gate driver 31 outputs a gate scanning signal to the gate scanning line 1, and the output Out of the Nth stage gate driver also outputs the gate scanning signal to the input Set of the N+1th stage gate driver. The reset port Reset of the Nth stage gate driver receives a gate scanning signal output from the output Out of the N+1th stage gate driver 31 as a reset signal, where N is a positive integer greater than 1.

Figure 6A:
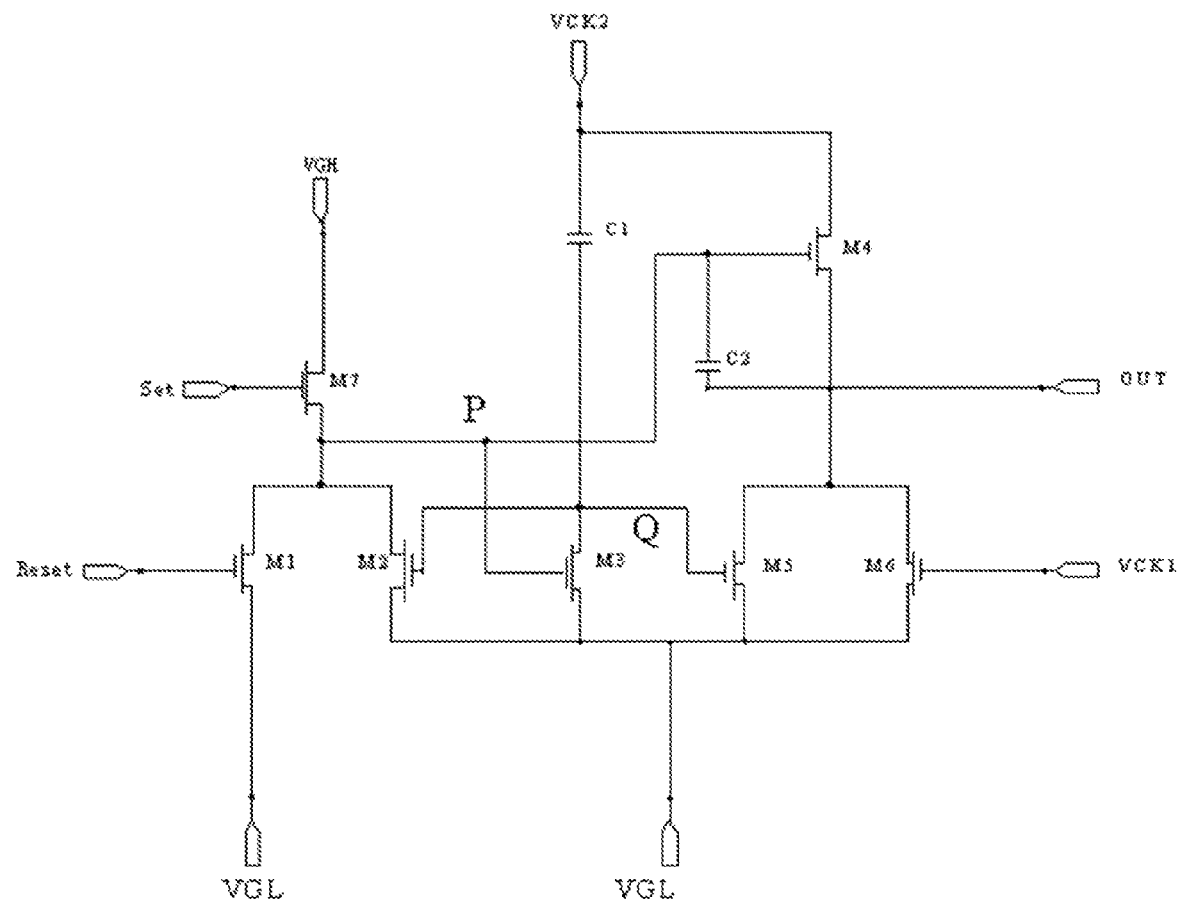
FIG. 6a is a structure diagram of a gate driver according to an embodiment of the present invention.

FIG. 6a is a simplified schematic diagram of a stage gate driver according to an embodiment of the present invention. As shown in FIG. 6a, the gate driver includes: a first transistor M1, a second transistor M2, a third transistor M3, a fourth transistor M4, a fifth transistor M5, a sixth transistor M6, a seventh transistor M7, a first capacitor C1 and a second capacitor C2.

In the case of the ith stage gate driver 31, the first transistor M1 includes a gate connected to the reset port Reset, a source connected to the gate of the fourth transistor M4, and a drain connected to the second level signal port GL to receive the second level signal VGL.

The second transistor M2 includes a gate connected to the source of the third transistor M3, a source connected to the gate of the fourth transistor M4, and a drain connected to the second level signal port GL to receive the second level signal VGL.

The third transistor M3 includes a gate connected to the drain of the seventh transistor M7, a drain connected to the second level signal port GL to receive the second level signal VGL, and a source connected to the second clock signal port CK2 via the first capacitor C1.

The fourth transistor M4 includes a gate connected to the drain of the seventh transistor M7, a source connected to the second clock signal port CK2 to receive the second clock signal VCK2, and a drain connected to the output Out of the gate driver. The gate of the fourth transistor M4 is also connected to the output Out of the gate driver 31 via the second capacitor C2.

The fifth transistor M5 includes a gate connected to the source of the third transistor M3, a source connected to the output Out of the gate driver 31, and a drain connected to the second level signal port GL to receive the second level signal VGL.

The sixth transistor M6 includes a gate connected to the first clock signal port CK1 to receive the first clock signal VCK1, a drain connected to the second level signal port GL to receive the second level signal VGL, and a source connected to the output Out of the gate driver.

The seventh transistor M7 includes a gate connected to the input Set of the gate driver 31, a source connected to the first level signal port GH to receive the first level signal VGH.

The jth stage gate driver 31 differs from the ith stage gate driver 31 in that:

the source of the fourth transistor M4 of the jth stage gate driver 31 is connected to the first clock signal port CK1 to receive the first clock signal VCK1; and the gate of the sixth transistor M6 of the jth stage gate driver 31 is connected to the second clock signal port CK2 to receive the second clock signal VCK2, where i is an odd-numbered integer not greater than N and j is an even-numbered integer not greater than N.

It should be noted that, in this embodiment, an input signal of the first level signal port GH is a high level signal VGH (i.e., the input signal has a constant level which is higher than the level of the low level signal to be input, and the first level signal has a voltage level in a range between 10V and 25V); an input signal of the second level signal port GL is a low level signal VGL (i.e., the input signal has a constant level which is lower than the level of the preceding high level signal, and the second level signal has a voltage level in a range between −12V and −8V). The first clock signal and the second clock signal are both pulse signals, where the second clock signal VCK2 is a reverse signal of the first clock signal VCK1, i.e., the cycles of the first clock signal VCK1 and the second clock signal VCK2 are the same, and the phases thereof are opposite. For example, in the first case, if the first clock signal VCK1 is a high level pulse signal, the second clock signal VCK2 may be a low level pulse signal. Alternatively in the second case, if the first clock signal VCK1 is a low level pulse signal, the second clock signal VCK2 may be a high level pulse signal. For convenience of explanation and without the intention of limiting the present invention, in the following description it is assumed that the first case is used as an example to describe embodiments of the present invention. The first clock signal and the second clock signal both have a high voltage level in a range between 10V and 25V, which are equal to the voltage of the first level signal. The first clock signal and the second clock signal both have a low voltage level in a range between −12V and −8V, which are equal to the second level signal voltage.

A driving process of the driving circuit with a feed through voltage compensation according to an embodiment of the present invention may be specified in the following, taking that the first clock signal VCK1 is a high level pulse signal and the second clock signal is a low level pulse signal as an example.

Figure 7:
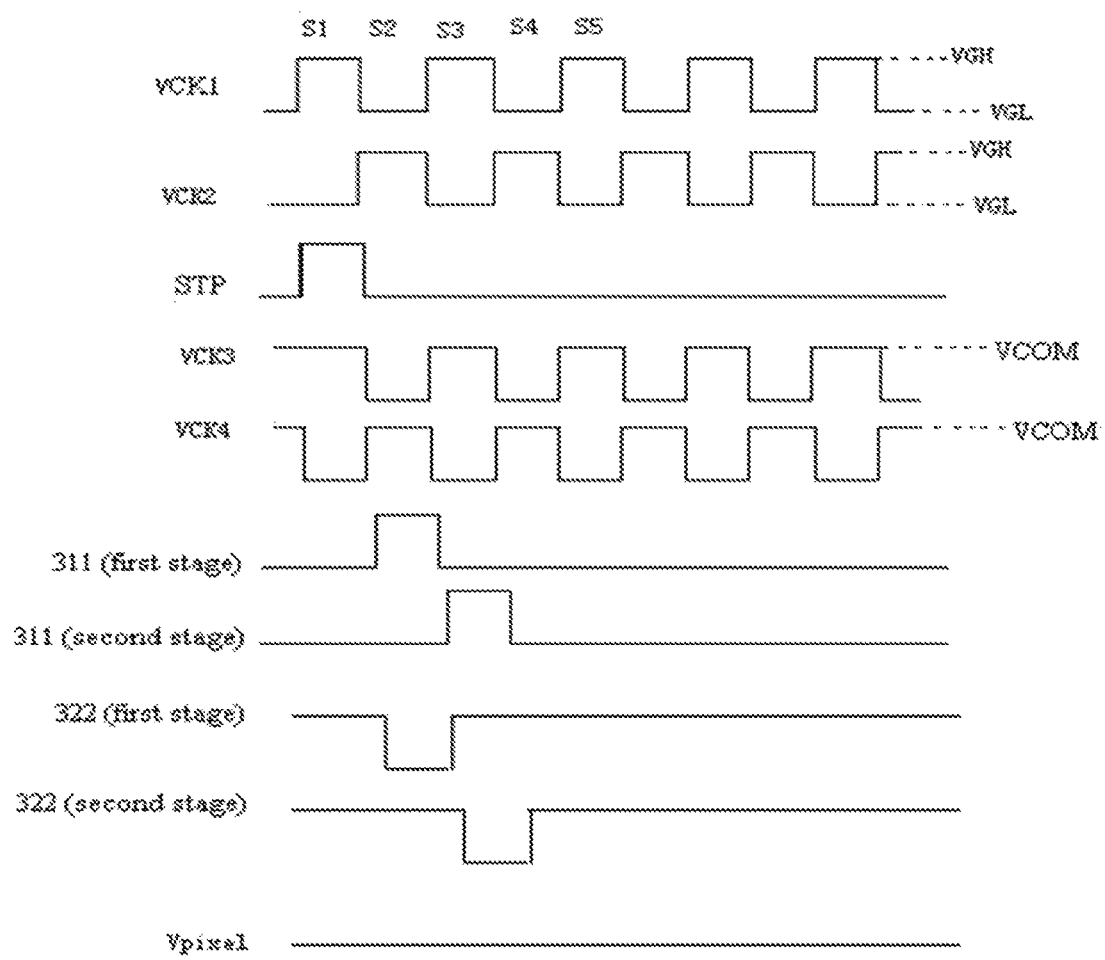
FIG. 7 is a schematic diagram of an operation waveform of multi-stages of common driving units according to an embodiment of the present invention.

FIG. 7 is a schematic diagram of an operation waveform of multi-stages of common driving units according to an embodiment of the present invention, which includes an operation waveform of the gate driver 31 shown in FIG. 6a. The driving process in time sequence of the gate driver 31 may be described in conjunction with FIG. 5, FIG. 6a and FIG. 7.

In the first phase S1, the first clock signal port CK1 is input with a half-cycle of the high level signal, and the second clock signal port CK2 is input with a half-cycle of the low level signal; the input Set of the first stage gate driver 31 is input with a high level signal (i.e., the high level in the entire initial pulse signal STP).

In this case, in the gate driver 31, the sixth transistor M6 of the gate driver 31 is switched on under the control of the first clock signal VCK1, and the second level signal VGL (i.e., a low level signal) is sent to the output Out of the gate driver 31, i.e., the output Out of the gate driver 31 outputs the second level signal VGL (i.e., a low level signal). In addition, the high level signal is input to the input Set of the gate driver 31 to switch on the seventh transistor M7, the fourth transistor M4 and third transistor M3. When the seventh transistor M7 is switched on, the first level signal VGH (i.e., the high level signal) is sent to the gates of the fourth transistor M4 and the third transistor M3. When the fourth transistor M4 is switched on, the second clock signal VCK2 (i.e., the low level signal) is sent to the output Out of the gate driver 31, i.e., the output Out of the gate driver 31 may receive the low level signal of the second clock signal port CK2.

In the second phase S2, the first clock signal port CK1 is input with a half-cycle of the low level signal, and the second clock signal CK2 is input with a half-cycle of the high level signal. Due to the effect of the second capacitor C2 (i.e., the bootstrap of the capacitor), a high level may be maintained at the node P. Therefore, the fourth transistor M4 may remain switched on under the control, and the second clock signal VCK2 may be sent to the output Out of the gate drive 31. Meanwhile, due to the first clock signal VCK1, the sixth transistor M6 may be switched off. Due to the high level maintained at the node P, the third transistor M3 may be switched on. The low level signal VGL of the second level signal GL may be sent to the node Q via the third transistor M3. Therefore, the fifth transistor M5 may be switched off. In this phase, the output Out of the first stage gate driver 31 may output the high level signal of the second clock signal VCK2; and the signal output from the output Out of the second stage gate driver 31 may be the same as the output of the first stage gate driver 31 in the first phase. That is, at this moment, the output Out of the second stage gate driver 31 may output the low level signal of the second clock signal port CK2.

In the third phase S3, the reset port Reset of the first stage gate driver 31 receives the high level signal output from the output Out of the second stage gate driver 31 (refer to the signal output from the Nth stage gate driver 31 in the second phase). Therefore, the first transistor M1 may be switched on and the second level signal VGL (i.e., the low level signal) may be transferred to the node P. Because the potential of the node P is decreased, the fourth transistor M4 and the third transistor M3 may be switched off. Meanwhile, the first clock signal VCK1 provides a half-cycle of the high level signal to control the sixth transistor M6 to be switched on and send the second level signal VGL (i.e., the low level signal) to the output Out. That is, the output Out may obtain the low level signal from the second level signal VGL. In this case, the signal output from the Out of the second stage gate driver 31 may be the same as the output of the first stage gate driver 31 in the second phase, i.e., at this moment, the Out of the second stage gate driver 31 may output the high level signal of the second clock signal VCK2.

In the fourth phase S4, the VCK2 is at a high level. Due to the coupling of the first capacitor C1, the high level may be maintained at the node Q. Therefore, the fifth transistor M5 and the second transistor M2 may remain switched on, and the second level signal VGL may be sent to the gate of the fourth transistor M4 via the second transistor M2 to control the fourth transistor M4 to be switched off. Meanwhile, the fifth transistor M5 is switched on, and the second level signal VGL (i.e., a low level signal) may be sent to the output Out. That is, the output Out may receive the low level signal of the second level signal VGL. In this case, the signal output from the output Out of the second stage gate driver 31 may be the same as the output of the first stage gate driver 31 in the third phase, i.e., at this moment, the output Out of the second stage gate driver 31 may obtain the low level signal from the second clock signal VGL.

In the fifth phase S5, the VCK2 is at a low level. Due to the coupling of the first capacitor C1, the low level may be maintained at the node Q. Therefore, the fifth transistor M5 may be switched off and the fourth transistor M4 may be switched off due to the low level of the node P. Meanwhile, the first clock signal port CK1 may output a half-cycle of the high level signal to switch in the sixth transistor M6, and therefore the second level signal VGL (i.e., the low level signal) may be sent to the output Out. That is, the output Out may output the low level signal of the second level signal VGL. In this case, the signal output from the output Out of the second stage gate driver 31 may be the same as the output of the first stage gate driver 31 in the fourth phase, i.e., at this moment, the output Out of the second stage gate driver 31 may obtain the low level signal from the second clock signal VGL.

Subsequently, the first stage gate driver 31 may output signals by repeating the process in phase 4 and phase 5. The second stage gate driver 31 may keep outputting signals a half cycle later than the first stage gate driver 31. That is, the N+1th stage gate driver 31 may keep outputting signals a half cycle later than Nth stage gate driver 31. Therefore, the output signal may be considered as a consecutive output stage of a shift register.

The structure and driving process of the storage capacitance driver 32 may be described as follows:

Referring back to FIG. 5, the storage capacitance driver 32 includes an input Set, an output Out, a reset port Reset, a first level signal port GH, a second level signal port GL, a third level signal port COM, a first clock signal port CK1, a second clock signal port CK2 and a common level clock signal port CKCOM (CK3/CK4). The first level signal port GH receives the first level signal VGH. The second level signal port GL receives the second level signal VGL. The third level signal port COM receives the third level signal VCOM. The first clock signal port CK1 receives the first clock signal VCK1. The second clock signal port CK2 receives the second clock signal VCK2. The common level clock signal port CKCOM (CK3/CK4) of the ith stage storage capacitance driver 32 receives a first common level clock signal VCK3. The common level clock signal port CKCOM (CK3/CK4) of the jth storage capacitance driver 32 receives a second common level clock signal VCK4, where i is an odd-numbered integer not greater than N, and j is an even-numbered integer not greater than N.

The input Set of the first stage storage capacitance driver 32 receives an initial pulse signal STP. Generally, the initial pulse signal STP may provide a high level signal at the beginning. The initial pulse signal STP has a high voltage level in a range between 10V and 25V, and a low voltage level in a range between −12V and −8V. The output Out of the first stage storage capacitance driver 32 outputs a storage capacitance signal to the storage capacitance line 2. The reset port Reset of the first stage storage capacitance driver 32 receives a gate scanning signal output from the output Out of the second gate driver 31 as a reset signal.

The input Set of the Nth stage storage capacitance driver 32 receives a gate scanning signal output from the output Out of the N−1th stage gate driver 31. The output Out of the Nth stage storage capacitance driver 32 sends a storage capacitance signal to the storage capacitance line 2. The reset port Reset of the Nth stage storage capacitance driver 32 receives a gate scanning signal output from the output Out of the N+1th stage storage capacitance driver 31 as a reset signal.

The initial pulse signal STP, the first level signal VGH, the second level signal VGL, the first clock signal VCK1, the second clock signal VCK2 of the storage capacitance driver 32 have the same features with those of the gate driver 31. In the storage capacitance driver, the input signal of the third level signal port COM is the third level signal VCOM, i.e., the third level signal VCOM has a constant level in a range between 0V and 5V. The first common level clock signal VCK3 and the second common level clock signal VCK4 are both pulse signals; and the first common level clock signal VCK3 is a reverse signal of the second common level clock signal VCK4. The common level clock signal port CKCOM (CK3/CK4) outputs the first common level clock signal VCK3 and the second common level clock signal VCK4 simultaneously. However, the first common level clock signal VCK3 may be only output to the ith stage storage capacitance driver, and the second common level clock signal VCK4 may be only output to the jth stage storage capacitance driver, where i is an odd-numbered integer not greater than N, and j is an even-numbered integer not greater than N. The voltages of the high levels of the first common level clock signal VCK3 and the second common level clock signal VCK4 have a high voltage level in a range between 0V and 5V, and a low voltage level in a range between −4V and 3V. The voltages of the high levels of the first common level clock signal VCK3 and the second common level clock signal VCK4 are equal to the voltage of the third level signal.

Figure 6B:
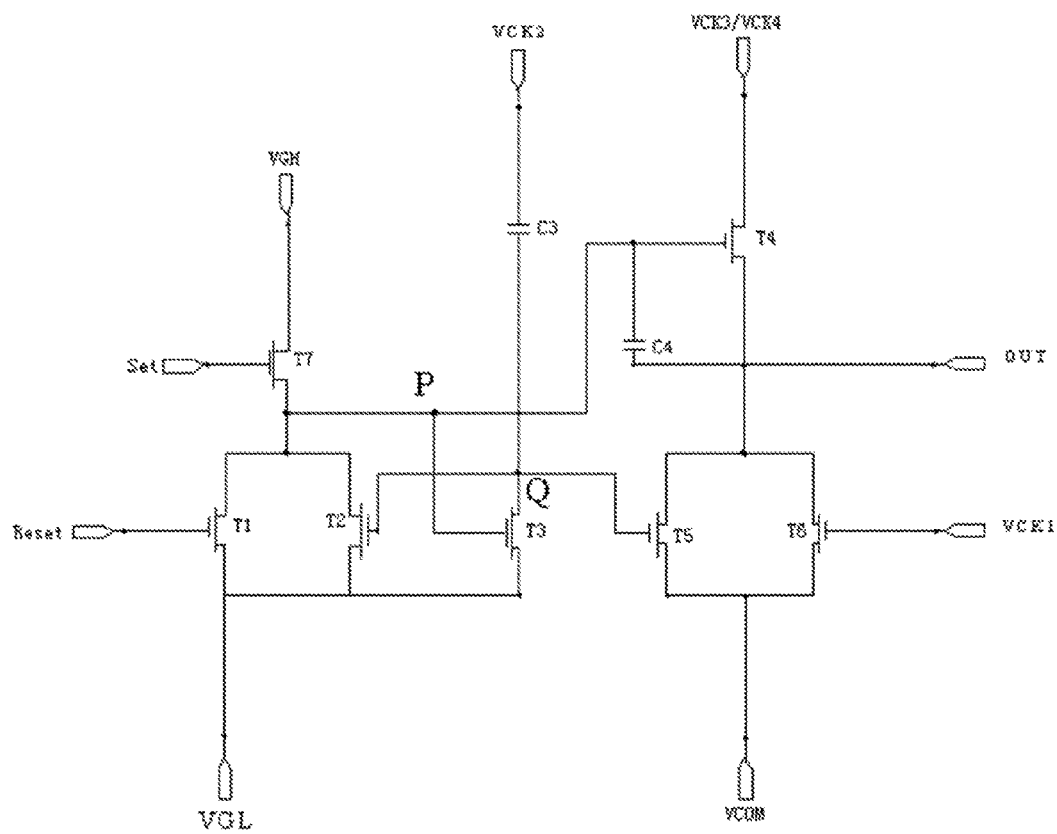
FIG. 6b is a structure diagram of a storage capacitance driver according to an embodiment of the present invention.

FIG. 6b is a structure diagram of a storage capacitance driver according to an embodiment of the present invention. As shown in FIG. 6b, the storage capacitance driver 32 includes: a first transistor T1, a second transistor T2, a third transistor T3, a fourth transistor T4, a fifth transistor T5, a sixth transistor T6, a seventh transistor T7, a third capacitor C3 and a the fourth capacitor C4.

In the case of the ith stage storage capacitance driver 32, the first transistor T1 includes a gate connected to the reset port Reset; a source connected to the gate of the fourth transistor T4; a drain connected to the second level signal port GL to receive the second level signal VGL.

The second transistor T2 includes a gate connected to the source of the third transistor T3; a source connected to the gate of the fourth transistor T4, and a drain connected to the second level signal port GL to receive the second level signal VGL.

The third transistor T3 includes a gate connected to the drain of the seventh transistor T7; a drain connected to the second level signal port GL to receive the second level signal VGL, and a source connected to the second clock signal port CK2 via the third capacitor C3 to receive the second clock signal VCK2.

The fourth transistor T4 includes the gate connected to the drain of the seventh transistor T7, the drain connected to the output Out of the storage capacitance driver 32, and the source connected to the common level clock signal port CKCOM(CK3/CK4). The gate of the fourth transistor T4 is connected to the output Out of the storage capacitance driver 32 via a fourth capacitor C4. The source of the fourth transistor T4 of the ith stage storage capacitance driver 32 receives the first common level clock signal VCK3, and the source of the fourth transistor T4 of the jth stage storage capacitance driver 32 receives the second common level clock signal VCK4, where i is an odd-numbered integer not greater than N, and the j is an even-numbered integer not greater than N.

The fifth transistor T5 includes a gate connected to the source of the third transistor T3; a drain connected to the third level signal port COM to receive the third level signal VCOM, and a source connected to the output Out of the storage capacitance driver 32.

The sixth transistor T6 includes a gate connected to the first clock signal port CK1 to receive the first clock signal VCK1; a drain connected to the third level signal port COM to receive the third level signal VCOM, and a source connected to the output Out of the storage capacitance driver.

The seventh transistor T7 includes a gate connected to the input Set of the storage capacitance driver, and a source connected to the first level signal port GH to receive the first level signal VGH.

The jth stage capacitance driver 32 differs from the ith storage capacitance driver 32 in that:

The source of the third transistor T3 of the jth stage storage capacitance driver 32 is connected to the first clock signal port CK1 via the third capacitor C3 to receive the first clock signal VCK1; and The gate of the sixth transistor T6 of the jth stage storage capacitance driver 32 is connected to the second clock signal port CK2 to receive the second clock signal VCK2, where i is an odd-numbered integer not greater than N, and j is an even-numbered integer not greater than N.

The driving process of the storage capacitance driver 32 may be described in conjunction with FIG. 5, FIG. 6*b* and FIG. 7.

In the first phase, the first clock signal port CK1 is input with a half-cycle of the high level signal. The second clock signal port CK2 is input with a half-cycle of the low level signal. The input Set of the first stage storage capacitance driver 32 is input with a high level signal, i.e., the high level part of the entire initial pulse signal.

In the case of the first storage capacitance driver 32, the sixth transistor T6 is switched on under the control of the first clock signal VCK1, and the third level signal VCOM may be sent to the output Out, i.e., the output Out may output the third level signal VCOM. The seventh transistor T7 of the storage capacitance driver 32 is switched on under the control of the high level signal input provided for the input Set of the storage capacitance driver 32, i.e., the high level part of the entire initial pulse signal STP. Therefore, the first level signal VGH (i.e., the high level signal) may be sent to the gates of the fourth transistor T4 and the third transistor T3 to control the fourth transistor T4 and the third transistor T3 to be switched on. After the fourth transistor T4 is switched on, the high level signal of the first common level clock signal VCK3 may be sent to the output Out of the storage capacitance driver 32, i.e., the output Out of the storage capacitance driver 32 may receive the high level signal from the first common level clock signal VCK3, where the value of the high level is equal to that of the third level signal.

In the second phase, the first clock signal port CK1 is input with a half-cycle of the low level signal, and the second clock signal port CK2 is input with a half-cycle of the high level signal. In the first stage storage capacitance driver 32, due to the effect of the fourth capacitor C4 (i.e., the bootstrap of the capacitor), a high level may be maintained at the node P. Therefore, the fourth transistor T4 may be switched on under the control; and the low level signal, i.e., the low level signal in the first common level clock signal VCK3, may be sent to the output Out. Meanwhile, due to the first clock signal VCK1, the sixth transistor T6 may be switched off. Due to the high level maintained at the node P, the third transistor T3 is switched on. The low level signal VGL of the second level signal port GL may be sent to the node Q via the third transistor T3. The level of the node Q may be a low level, and the fifth transistor T5 may be switched off under the control. Therefore, the output Out of the first stage storage capacitance driver 32 may output the low level signal, i.e., the low level signal of the first common level clock signal VCK3.

However, the output signal of the second stage storage capacitance driver 32 in this phase differs from the output signal of the first stage storage capacitance driver 32 in the first phase in that the output Out of the second stage storage capacitance driver 32 outputs the high level signal of the second common level clock signal VCK4, and the value of the high level signal is equal to that of the third level signal.

In the third phase, the reset Reset of the first stage storage capacitance driver 32 receives the high level signal output from the output Out of the second stage gate driver 31 (refer to the signal output from the first stage gate driver 31 in phase 2). The first transistor T1 may be switched on to send the second level signal VGL (i.e., the low level signal) to the node P. In this phase, because the level of the node P is decreased, the fourth transistor T4 and the third transistor T3 may be switched off. The first clock signal VCK1 outputs a half-cycle of the high level signal to control the sixth transistor T6 to be switched on. The third level signal VCOM input to the third level signal port COM may be transmitted to the output Out of the first stage storage capacitance driver 32.

The output signal of second stage storage capacitance driver 32 in this phase differs from the output signal of the first stage storage capacitance driver 32 in the second phase in that the output Out of the second stage storage capacitance driver 32 may output the low level signal of the second common level clock signal VCK4.

In the fourth phase, the VCK2 is in a high level. Due to the coupling of the third capacitor C3, the high level may be maintained at the node Q. Therefore, the fifth transistor T5 and the second transistor T2 may be switched on, and the second transistor T2 may transmit the second level signal VGL to the gate of the fourth transistor T4. Thus, the fourth transistor T4 may be switched off, and the fifth transistor T5 is switched on. The third level signal VCOM input to the third level signal port COM may be transmitted to the output Out, i.e., the output Out may output the third level signal VCOM.

The output signal of the second stage storage capacitance driver 32 in this phase is the third level signal VCOM, which is the same as the output signal of the first stage storage capacitance driver 32 in the third phase.

In the fifth phase, the VCK2 is in a low level. Due to the coupling of the third capacitor C3, the low level may be maintained at the node Q to control the fifth transistor T5 and the second transistor T2 to be switched off. Meanwhile, the first clock signal CK1 outputs a half-cycle of the high level signal to control the sixth transistor T6 to be switched on. The third level signal VCOM input to the third level signal port COM may be sent to the output of the storage capacitance driver 32, i.e., the output Out may output the third level signal VCOM. However, the output signal of the second stage storage capacitance driver 32 in this phase is the third level signal VCOM, which is the same as the output signal of the first stage storage capacitance driver 32 in the fourth phase.

Subsequently, the first storage capacitance driver 32 may output signals by repeating the process described in phase 4 and phase 5. The second stage storage capacitance driver 32 may keep outputting signals a half cycle later than the first stage storage capacitance driver 32. That is, the N+1th stage storage capacitance driver 32 may keep outputting signals a half cycle later than the Nth stage storage capacitance driver 32. Therefore, the output signal may be considered as a consecutive output in shift registering.

Figure 8:
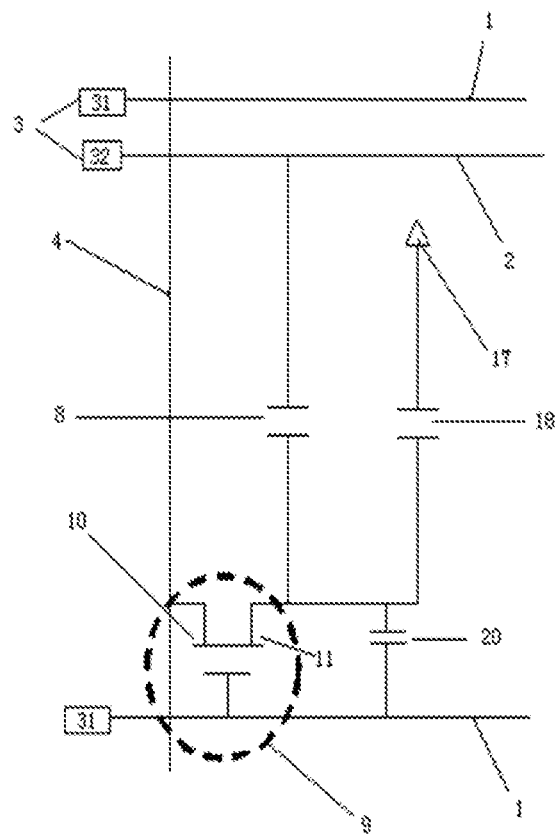
FIG. 8 is an equivalent circuit diagram of a pixel according to an embodiment of the present invention.

As described in the above and as shown in FIG. 7 and FIG. 8, in the second phase, after the storage capacitance line 2 in a pixel is applied with a storage capacitance signal 322 which has a reverse phase to the gate scanning signal 311 of the gate scanning line 1. FIG. 8 is an equivalent circuit diagram of a pixel according to an embodiment of the present invention. As shown in FIG. 8, a pixel unit 6 includes a pixel electrode. A storage capacitance 8 is formed between the pixel electrode and the store capacitance line 2. A liquid crystal capacitance 18 is formed between the pixel electrode and the common electrode 17. A parasitic capacitance 20 is formed between the drain 11 and the gate scanning line. In conjunction with FIG. 7 and FIG. 8, the feed through voltage of the pixel may be modulated by the storage capacitance signal 322 of the storage capacitance line 2 and the gate scanning signal 311 of the gate scanning line 1. Preferably, the feed through voltage of the pixel may be approximately equal to 0. That is, at this moment, the pixel voltage $V_{pixel}$ may maintain constant, the parasitic capacitance 20 (also called a gate-to-drain parasitic capacitance $C_{gd}$) between the gate scanning line 1 and the drain 11 may be designed without the effect of the feed through voltage. In this way, the value of parasitic capacitance 20 may be designed to be very large, i.e., the overlapped area of the gate scanning line 1 and the drain 11 may not be restricted.

Therefore, based on the driving circuit with the feed through voltage compensation, an array substrate is provided by an embodiment of the present invention. As shown in FIG. 4, the array substrate includes a display area 5 and a non-display area, and the driving circuit with a feed through voltage compensation is disposed in the non-display area.

The display area 5 includes: multiple gate scanning lines 1 disposed generally in parallel to each other; multiple storage capacitance lines 2 disposed generally in parallel, where the storage capacitance lines 2 are parallel to the gate scanning lines 1. The display area 5 also includes multi-stages of common driving units 3 where the Nth stage common driving unit 3 is connected to the Nth stage gate scanning line 1 and the Nth stage storage capacitance line 2, and the respective common driving units 3 are connected in series; data lines 4 intersected with gate scanning lines 1 and disposed in parallel, where the data lines 4 vertically intersect the gate scanning lines 1 and are insulated from the gate scanning lines 1; and pixel units 6 are defined by the gate scanning lines 1 and the data lines 4, the gate scanning lines 1 and the data lines 4 are intersected vertically. In conjunction with FIG. 8, each pixel unit 6 includes a pixel electrode. A liquid crystal capacitance 18 is formed between the pixel electrode and the common electrode 17. A parasitic capacitance 20 is formed between the drain 11 and the gate scanning line 1.

The thin-film transistors 9 are disposed at the intersections of the gate scanning lines 1 and the data lines 4. Each thin-film transistor 9 includes a source 10 connected to the data line 4 and a drain 11 connected to the pixel electrode.

Figure 9A:
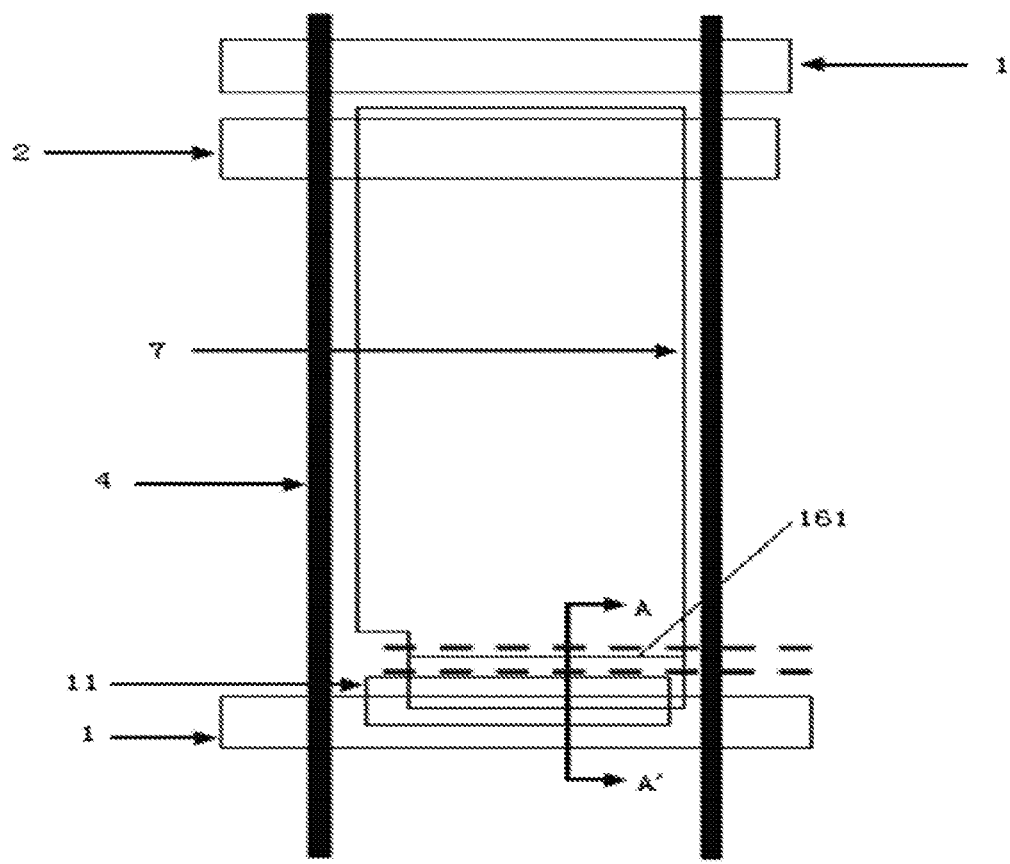
FIG. 9a is a schematic diagram of a pixel unit according to an embodiment of an embodiment of the present invention.

FIG. 9a is a schematic diagram of a pixel unit according to an embodiment of the present invention. The drain 11 and the gate scanning line 1 are overlapped partly. The storage capacitance line 2 includes an end portion paralleled to the gate scanning line 1 and comb-tooth portions which are extended into the pixel unit 6 and paralleled to the data line 4 (not shown in FIG. 9a).

Figure 9B:
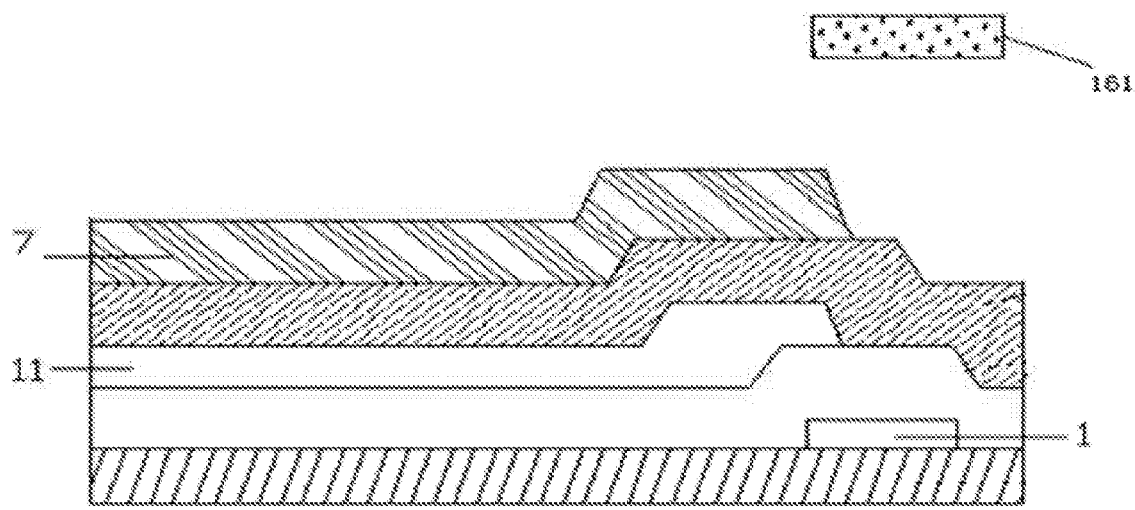
FIG. 9b is a sectional view taken along A-A' of FIG. 9a, showing the schematic diagram of the pixel unit.

As shown in FIG. 9a, the drain 11 is a bar-shaped structure extending along the extension direction of the gate scanning 1. The drain 11 partially overlaps with a portion of the gate scanning line 1 in the extension direction of the gate scanning line 1, and the portion in which the drain 11 is overlapped with the gate scanning 1 has a width greater than or equal to 1 micrometer. A black matrix 161 partially overlaps with the edge of the pixel electrode 7 to cover an abnormal display area. FIG. 9b is a sectional view taken along A-A' of FIG. 9a, showing the schematic diagram of the pixel unit. As shown in FIG. 9b, by adopting the driving circuit with a feed through voltage compensation, a large parasitic capacitance may be designed, i.e., the pixel electrode 7 may be disposed close to the gate scanning line 1 or even partially overlaps with the gate scanning line 1. Therefore, the black matrix 161 for shielding a gap present between the drain 11 and the gate scanning line 1 (i.e., the drain 11 may even go so far as to overlap partially with the gate scanning line 1) may have a narrow width. Therefore, the width of the black matrix 161 in this embodiment of the present invention may become substantially narrower than that in the prior art, and thus the aperture ratio may be increased and the power consumption may be reduced.

Embodiment 2

A driving circuit with a feed through voltage compensation according to the embodiment is same as the driving circuit with the feed through voltage compensation described in the first embodiment. That is, the embodiments provides the driving circuit including the multi-stages of the common driving units 3 connected in series, where each stage of the common driving unit 3 includes a gate driver 31 and a storage capacitance driver 32. An output of the Nth stage gate driver is connected to an end of the Nth stage gate scanning line, and the inputs of the N+1th stage gate driver and the N+1th stage storage capacitance driver to provide a gate scanning signal. The output of the Nth stage storage capacitance driver is connected to an end of the Nth stage storage capacitance line to provide a storage capacitance signal. The reset port of the Nth stage gate driver and the reset port of the Nth stage storage capacitance driver are connected to the output of the N+1th gate driver to receive the gate signal of the N+1th gate driver, where N is a positive integer not greater than 1.

The storage capacitance signal output from the storage capacitance driver is adapted to compensate the gate scanning signal output from the gate driver.

The embodiment 2 differs from the embodiment 1 in that the drain is in a square structure and only be disposed at the intersection of the gate scanning line 1 and the data line 4.

Figure 10A:
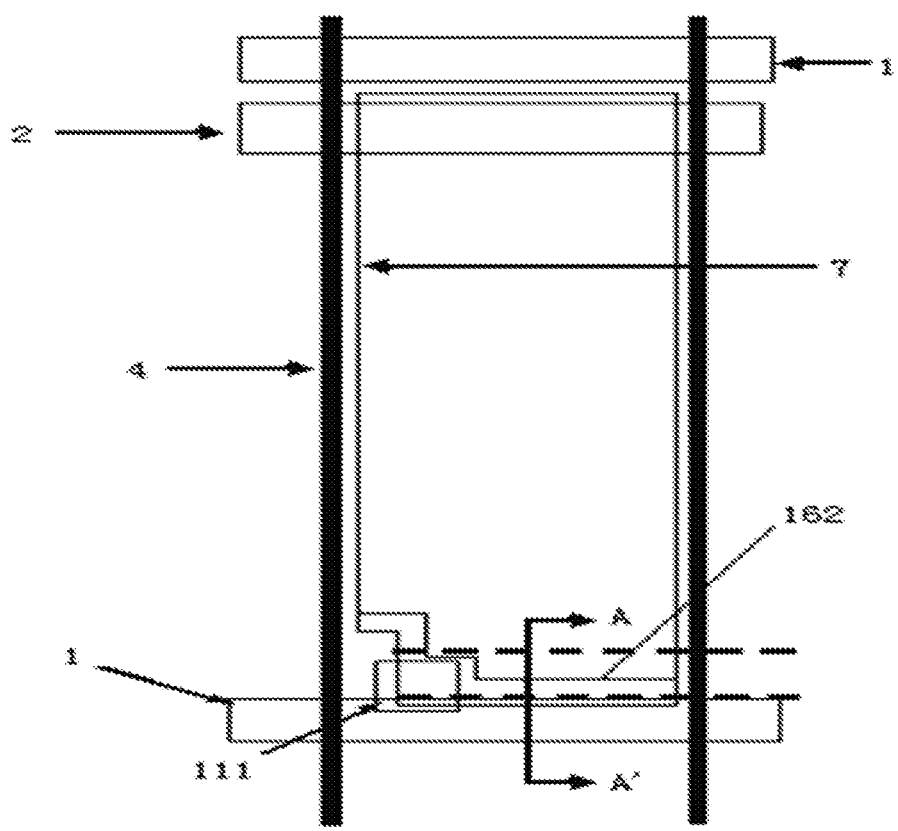
FIG. 10a is a schematic diagram of a pixel unit according to another embodiment of an embodiment of the present invention.
Figure 10B:
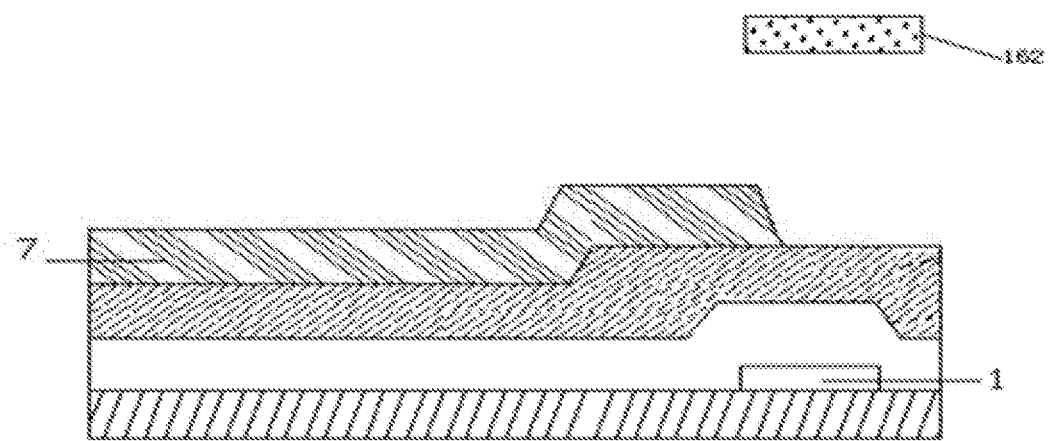
FIG. 10b is a sectional view taken along A-A' of FIG. 10a, showing the schematic diagram of the pixel unit.

FIG. 10a is a schematic diagram of a pixel unit according to another embodiment of the disclosure. The drain 11 is in a square structure and only be disposed at the intersection of the gate scanning line 1 and the data line 4. The pixel electrode of the pixel unit 6 extends to the gate scanning line 1 and partially overlaps with a portion of the gate scanning line 1. The overlapped portion between the pixel electrode and the gate scanning line 1 has a width greater than or equal to 1 micrometer. A black matrix 162 partially overlaps with the edge of the pixel electrode 7 to shield the abnormal display area. FIG. 10b is a sectional view taken along A-A' of FIG. 10a, showing the schematic diagram of pixel unit. As shown in FIG. 10b, by adopting the driving circuit with the feed through voltage compensation, a large parasitic capacitance may be designed, i.e., the pixel electrode 7 may be close to the gate scanning line 1 or even be overlapped partly with the gate scanning line 1. Therefore, the black matrix 162 for shielding the gap exists between pixel electrode 7 and the gate scanning line 1 (i.e., pixel electrode 7 may even go so far as to overlapped partly with the gate scanning line 1) may have a narrow width. Therefore, in this embodiment, the width of the black matrix 162 may be obviously narrower than that in the prior art, and hence the pixel aperture ratio may be increased and the power consumption may be reduced.

In addition, the transistors of the gate drivers 31 and the storage capacitance drivers 32 in the non-display area have a semiconductor layer made of any one of the amorphous silicon, the oxide-metal and the low temperature poly-silicon.

In conclusion, with regard to the gate driver 31 and the storage capacitance driver 32 (i.e., the common driving unit 3) exampled in the embodiment 1 and the embodiment 2, when the gate scanning signal 311 output from the gate driver 31 and the storage capacitance signal 322 output from the storage capacitance driver 32 are in a stable state. That is, from the third phase, the output Out of the gate driver 31 may keep outputting a stable second level signal VGL, and the output Out of the storage capacitance driver 32 may keep outputting an stable third level signal VCOM. Therefore, the distortion of the output signal may be avoided, and the reliability of the gate driver 31 and the storage capacitance driver 32 and the driving method thereof may be improved. In the two pixel structures basing on the driving circuit with the feed through voltage compensation, the black matrix may have a narrow width, thereby increasing the pixel aperture ratio and reducing the power consumption.

The above description is only the preferable embodiment according to the disclosure, but not the limitation to the scope thereof. Any modification and improvement basing on the disclosure made by those skilled in the art may fall into the protection scope of the claims.

Obviously, various modifications and improvements of the disclosure may be made by those in the art according to the principle and scope of the disclosure. Therefore, if the modifications and improvements of the disclosure are involved in the claims of the disclosure and the equivalent technology, the disclosure may involve these modifications and improvements.

What is claimed is:

1. A driving circuit with a feed through voltage compensation, comprising:
    a plurality of gate scanning lines;
    a plurality of storage capacitance lines;
    a plurality of stages of common driving units connected in series, wherein each of the stages of the common driving units is associated with one of the gate scanning lines and one of the storage capacitance lines, wherein each stage of the common driving units comprises:
    a gate driver having an input, an output, a reset port, a first clock signal port and a second clock signal port; and
    a storage capacitance driver having an input, an output, a reset port, a first clock signal port, a second clock signal port and a common level clock signal port;
    wherein, for an Nth stage of the common driving unit, an output of an Nth stage gate driver is connected to an associated gate scanning line to provide a gate scanning signal, N being an integer greater than 1;
    wherein the output of the Nth stage gate driver is further connected to an input of an N+1th stage gate driver and an input of an N+1th stage storage capacitance driver;
    wherein an output of an Nth stage storage capacitance driver is connected to an associated storage capacitance line to provide a storage capacitance signal;
    wherein a reset port of the Nth stage gate driver and a reset port of the Nth stage storage capacitance driver are connected to an output of the N+1th stage gate driver to receive a gate scanning signal of the N+1th stage gate driver;
    wherein the storage capacitance signal provided by the Nth stage storage capacitance driver is adapted to compensate the gate scanning signal provided by the Nth stage gate driver;
    wherein both the Nth stage gate driver and the Nth stage storage capacitance driver receive a first clock signal and a second clock signal;
    wherein a common level clock signal port of the Nth stage storage capacitance driver receives a first common level clock signal or a second common level clock signal;
    wherein the first clock signal, the second clock signal, the first common level clock signal and the second common level clock signal are all different;
    wherein the Nth stage storage capacitance driver comprises: a first transistor, a second transistor, a third transistor, a fourth transistor, a fifth transistor, a sixth transistor, a seventh transistor;
    the first transistor comprises a gate connected to the reset port of the Nth stage storage capacitance driver, a source connected to a gate of the fourth transistor, and a drain connected to a second level signal port to receive a second level signal;
    the second transistor comprises a gate connected to a source of the third transistor, a source connected to the gate of the fourth transistor, and a drain connected to the second level signal port to receive the second level signal;
    the third transistor comprises a gate connected to a drain of the seventh transistor, a drain connected to the second level signal port to receive the second level signal, and a source connected to receive a clock signal via a third capacitor, wherein, when N is an odd number, the source is connected to a second clock signal port to receive the second clock signal, when N is an even number, the source is connected to a first clock signal port to receive the first clock signal;
    the fourth transistor comprises a gate connected to the drain of the seventh transistor, a drain connected to the output of the Nth stage storage capacitance driver, a gate connected to the output of the Nth stage storage capacitance driver via a fourth capacitor, and a source of the fourth transistor is further connected to a common level clock signal port, wherein, when N is an odd number, the source of the fourth transistor receives the first common level clock signal, and when N is an even number, the source of the fourth transistor receives the second common level clock signal;
    the fifth transistor comprises a gate connected to the source of the third transistor, a drain connected to a third level signal port to receive a third level signal, and a source connected to the output of the Nth stage storage capacitance driver;
    the sixth transistor comprises a gate connected to receive a clock signal, a drain connected to the third level signal port to receive the third level signal, and a source connected to the output of the Nth stage storage capacitance driver, wherein, when N is an odd number, the gate is connected to the first clock signal port to receive the first clock signal, when N is an even number, the gate is connected to the second clock signal port to receive the second clock signal;
    the seventh transistor comprises a gate connected to the input of the Nth stage storage capacitance driver to receive a input signal, and a source connected to a first level signal port to receive a first level signal, wherein a voltage of the first level signal is a voltage of high level of the first clock signal.

2. The driving circuit according to claim 1, wherein
    the Nth stage gate driver further comprises a first level signal port, a second level signal port;
    an input of a first stage gate driver receives an initial pulse signal; and
    the first level signal port receives a first level signal, the second level signal port receives a second level signal, the first clock signal port receives the first clock signal, and the second clock signal port receives the second clock signal.

3. The driving circuit according to claim 2, wherein
the initial pulse signal has a high voltage level in a range between 10V and 25V and a low voltage level in a range between −12V and −8V.

4. The driving circuit according to claim 2, wherein
the first clock signal is a reverse signal of the second clock signal.

5. The driving circuit according to claim 2, wherein
the first clock signal and the second clock signal are both pulse signals, the first clock signal and the second clock signal have a high voltage level in a range between 10V and 25V, and low voltage level in a range between −12 V and −8V.

6. The driving circuit according to claim 2, wherein
the first level signal has a voltage in a range between 10V and 25V, and the second level signal has a voltage between −12V to −8V.

7. The driving circuit according to claim 1,
wherein the Nth stage storage capacitance driver further comprises a first level signal port, a second level signal port, a third level signal port;
wherein an input of a first stage storage capacitance driver receives an initial pulse signal; and
wherein the first level signal port receives a first level signal, the second level signal port receives a second level signal, the third level signal port receives a third level signal, the first clock signal port receives the first clock signal, and the second clock signal port receives the second clock signal.

8. The driving circuit according to claim 7, wherein
the first common level clock signal is a reverse signal of the second common level clock signal.

9. The driving circuit according to claim 7, wherein
the first common level clock signal and the second common level clock signal are both pulse signals, wherein the first common level clock signal and the second common level clock signal have a high voltage level in a range between 0V and 5V, and a low voltage level in a range between −4 V and 3V.

10. The driving circuit according to claim 7, wherein
the third level signal has a voltage level in a range between 0V and 5V, and the first common level clock signal and the second common level clock signal have a high voltage level equal to a voltage of the third level signal.

11. The driving circuit according to claim 1, wherein
the Nth stage gate driver further comprises a first transistor, a second transistor, a third transistor, a fourth transistor, a fifth transistor, a sixth transistor, a seventh transistor,
the first transistor comprises a gate connected to the reset port, a source connected to a gate of the fourth transistor, and a drain connected to a second level signal port to receive a second level signal;
the second transistor comprises a gate connected to a source of the third transistor, a source connected to the gate of the fourth transistor, and a drain connected to the second level signal port to receive the second level signal;
the third transistor comprises a gate connected to a drain of the seventh transistor, a drain connected to the second level signal port to receive the second level signal, and a source connected to a second clock signal port via a first capacitor;
the fourth transistor comprises a gate connected to the drain of the seventh transistor, a source connected to receive a clock signal, a drain connected to the output of the stage gate driver, and the gate of the fourth transistor further connected to the output of the stage gate driver via a second capacitor, wherein, when N is an odd number, the source is connected to a second clock signal port to receive the second clock signal, when N is an even number, the source is connected to a first clock signal port to receive the first clock signal;
the fifth transistor comprises a gate connected to the source of the third transistor, a source connected to the output of the stage gate driver, and a drain connected to the second level signal port to receive the second level signal;
the sixth transistor comprises a gate connected to receive a clock signal, a drain connected to the second level signal port to receive the second level signal, and a source connected to the output of the stage gate driver, wherein, when N is an odd number, the gate is connected to the first clock signal port to receive the first clock signal, when N is an even number, the gate is connected to the second clock signal port to receive the second clock signal;
the seventh transistor comprises a gate connected to the input of the Nth stage gate driver, and a source connected to a first level signal port to receive a first level signal.

12. The driving circuit according to claim 11, all of the first transistor, the second transistor, the third transistor, the fourth transistor, the fifth transistor, the sixth transistor, and the seventh transistor are the same type of transistor.

13. The driving circuit according to claim 1, an input signal of a first stage gate driver is the same as an input signal of a first stage storage capacitance driver.

14. An array substrate comprising:
a display area and a non-display area, wherein the non-display area comprises a driving circuit having a feed through voltage compensation, the driving circuit comprises:
a plurality of gate scanning lines;
a plurality of storage capacitance lines;
a plurality of stages of common driving units connected in series, wherein each of the stages of the common driving units is associated with one of the plurality of gate scanning lines and one of the plurality of storage capacitance lines, each stage of the common driving unit comprising:
a gate driver having an input, an output, and a reset port, a first clock signal port and a second clock signal port; and
a storage capacitance driver having an input, an output, a reset port, a first clock signal port, a second clock signal port and a common level clock signal port;
wherein, for an Nth stage of the common driving unit, an output of an Nth stage gate driver is connected to an associated gate scanning line to provide a gate scanning signal, N being an integer greater than 1;
the output of the Nth stage gate driver is further connected to an input of an N+1th stage gate driver and an input of an N+1th stage storage capacitance driver;
an output of an Nth stage storage capacitance driver is connected to an associated storage capacitance line to provide a storage capacitance signal;
an reset port of the Nth stage gate driver and a reset port of the Nth stage storage capacitance driver are connected to an output of the N+1th stage gate driver to receive a gate scanning signal of the N+1th stage gate driver;

the storage capacitance signal provided by the Nth stage storage capacitance driver is adapted to compensate the gate scanning signal provided by the Nth stage gate driver;

both the Nth stage gate drivers and the Nth stage storage capacitance drivers receive a first clock signal and a second clock signal;

a common level clock signal port of the Nth stage storage capacitance driver receives a first common level clock signal or a second common level clock signal, wherein the first clock signal, the second clock signal, the first common level clock signal and the second common level clock signal are all different;

wherein the display area comprises:
the plurality of the gate scanning lines;
a plurality of data lines;
a plurality of pixel units defined by intersections of the gate scanning lines and the data lines, each of the pixel units comprising a pixel electrode;
a plurality of storage capacitance lines;
a plurality of storage capacitances formed between the pixel electrodes and the storage capacitance lines;
a plurality of thin-film transistors disposed at the intersections of the gate scanning lines and the data lines, wherein each thin-film transistor comprises a source connected to a data line and a drain connected to a pixel electrode, and wherein the drain partially overlaps with a portion of a gate scanning line;

wherein the Nth stage storage capacitance driver comprises: a first transistor, a second transistor, a third transistor, a fourth transistor, a fifth transistor, a sixth transistor, a seventh transistor;

the first transistor comprises a gate connected to the reset port of the Nth stage storage capacitance driver, a source connected to a gate of the fourth transistor, and a drain connected to a second level signal port to receive a second level signal;

the second transistor comprises a gate connected to a source of the third transistor, a source connected to the gate of the fourth transistor, and a drain connected to the second level signal port to receive the second level signal;

the third transistor comprises a gate connected to a drain of the seventh transistor, a drain connected to the second level signal port to receive the second level signal, and a source connected to receive clock signal via a third capacitor, wherein, when N is an odd number, the source is connected to a second clock signal port to receive the second clock signal, when N is an even number, the source is connected to a first clock signal port to receive the first clock signal;

the fourth transistor comprises a gate connected to the drain of the seventh transistor, a drain connected to the output of the Nth stage storage capacitance driver, a gate connected to the output of the Nth stage storage capacitance driver via a fourth capacitor, and a source of the fourth transistor is further connected to a common level clock signal port, wherein, when N is an odd number, the source of the fourth transistor receives the first common level clock signal, and, when N is an even number, the source of the fourth transistor receives the second common level clock signal;

the fifth transistor comprises a gate connected to the source of the third transistor, a drain connected to a third level signal port to receive a third level signal, and a source connected to the output of the Nth stage storage capacitance driver;

the sixth transistor comprises a gate connected to receive a first clock signal, a drain connected to the third level signal port to receive the third level signal, and a source connected to the output of the Nth stage storage capacitance driver, wherein, when N is an odd number, the gate is connected to the first clock signal port to receive the first clock signal, when N is an even number, the gate is connected to the second clock signal port to receive the second clock signal;

the seventh transistor comprises a gate connected to the input of the Nth stage storage capacitance driver to receive a input signal, and a source connected to a first level signal port to receive a first level signal, wherein a voltage of the first level signal is a voltage of high level of the first clock signal.

15. The array substrate according to claim 14, wherein the drain has a bar-shaped structure disposed along a direction of the gate scanning line, and the drain overlaps with the portion of the gate scanning line in the direction of the gate scanning line.

16. The array substrate according to claim 15, wherein the portion of the plurality of gate scanning line has a width larger than or equal to 1 micrometer.

17. The array substrate according to claim 14, wherein the drain has a square structure and is only disposed at the intersection of the plurality of gate scanning line and the plurality of data lines, the pixel electrode in the pixel unit extends to the plurality of gate scanning line and partially overlaps with a portion of one of the plurality of gate scanning line.

18. The array substrate according to claim 17, wherein the portion of the gate scanning line has a width larger than or equal to 1 micrometer.

19. The array substrate according to claim 14, wherein one of the plurality of the storage capacitance lines comprises an end portion disposed in parallel to the plurality of gate scanning lines; and a plurality of comb-tooth portions extending into the pixel unit and paralleled to one of the plurality of data lines.

20. The array substrate according to claim 14, wherein an input signal of a first stage gate driver is the same as an input signal of a first stage storage capacitance driver.

* * * * *